(12) United States Patent
Nagasawa

(10) Patent No.: US 9,057,565 B2
(45) Date of Patent: Jun. 16, 2015

(54) COOLING DEVICE AND ELECTRONIC DEVICE

(75) Inventor: Hideo Nagasawa, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 389 days.

(21) Appl. No.: 13/515,185

(22) PCT Filed: Dec. 13, 2010

(86) PCT No.: PCT/US2010/060117
§ 371 (c)(1),
(2), (4) Date: Feb. 6, 2013

(87) PCT Pub. No.: WO2011/072297
PCT Pub. Date: Jun. 16, 2011

(65) Prior Publication Data
US 2013/0128461 A1    May 23, 2013

(30) Foreign Application Priority Data

Dec. 12, 2009  (JP) .................. 2009-282318

(51) Int. Cl.
| | |
|---|---|
| H05K 7/20 | (2006.01) |
| F28F 3/02 | (2006.01) |
| G06F 1/20 | (2006.01) |
| H01L 23/367 | (2006.01) |
| H01L 23/427 | (2006.01) |
| F28D 15/02 | (2006.01) |

(52) U.S. Cl.
CPC ... *F28F 3/02* (2013.01); *G06F 1/20* (2013.01); *G06F 1/203* (2013.01); *H01L 23/367* (2013.01); *H01L 23/427* (2013.01); *F28F 3/022* (2013.01); *F28D 15/0233* (2013.01); *H05K 7/2039* (2013.01); *H01L 2924/0002* (2013.01)

(58) Field of Classification Search
USPC .................. 361/704, 703, 702, 701
See application file for complete search history.

(56) References Cited

U.S. PATENT DOCUMENTS

2004/0050535 A1 * 3/2004 Malone et al. ............... 165/80.3

FOREIGN PATENT DOCUMENTS

| JP | 64-049247 | 2/1989 |
|---|---|---|
| JP | 2002-064170 | 2/2002 |
| JP | 2005-072542 | 3/2005 |
| JP | 2008-270609 | 11/2008 |

OTHER PUBLICATIONS

International Search Report for PCT/US2010/060117.

* cited by examiner

*Primary Examiner* — Andargie M Aychillhum

(57) ABSTRACT

The cooling device comprises a base with a recessed part in a first surface, a plurality of heat radiating fins standing erect on a second surface on the reverse side of the first surface, and a flat, plate-like thermal diffusion part housed inside the recessed part. The upper surface of the thermal diffusion part makes thermal contact with the upper surface of the recessed part, the side surface of the thermal diffusion part makes thermal contact with the side surface of the recessed part, and the thermal diffusion part diffuses in the planar and orthogonal directions heat from the heat generating element arranged on the bottom surface of the thermal diffusion part by vaporizing and condensing coolant sealed inside.

20 Claims, 6 Drawing Sheets

COOLING DEVICE AND ELECTRONIC DEVICE

REFERENCE TO RELATED APPLICATIONS

The Present Application claims priority to prior-filed Japanese Application No. 2009-282318, entitled "Cooling Device, Electronic Device," and filed 12 Dec. 2009, the contents of which is fully incorporated in its entirety herein.

BACKGROUND OF THE PRESENT APPLICATION

The Present Application relates to a cooling device for diffusing heat from a heat generating element such as an electronic component and radiating the diffused heat to the outside, and the Present Application relates more specifically to a small cooling device with a superior thermal design.

Electronic devices, industrial equipment and automobiles all use elements and electronic components such as semiconductor integrated circuits, LED elements and power devices that generate a lot of heat. When the heat generated by these elements and electronic components is above a given temperature, the operation of these elements and components cannot be ensured and the heat has an adverse effect on other components and on the case. As a result, the performance of the electronic device or industrial equipment may deteriorate. In order to cool these heat generating elements, a heat sink or heat pipe is used.

Because of market demand for smaller and thinner electronic devices and industrial equipment, semiconductor integrated circuits have become even more integrated and electronic components have become even smaller. As the performance and processing power of these smaller electronic components has increased, the amount of heat generated by the heat generating elements has increased significantly. If the heat generating element is a semiconductor integrated circuit, light-emitting device or power device, the amount of heat generated by the small heat generating element is considerable.

When these heat generating elements are cooled by a heat sink, the cooling performance is inadequate. As a result, heat sinks have been replaced by heat pipes which cool heat generating elements by vaporizing and condensing a coolant sealed inside. When the amount of heat generated by the heat generating element is considerable, a very large heat pipe is needed to diffuse the heat. When the heat pipe plays a major role in diffusing heat and the amount of heat generated by a very small heat generating element is considerable, there is a significant size discrepancy between the heat generating element and the heat pipe, and the thermal diffusion is inadequate.

When a heat pipe is combined with a heat sink to diffuse heat, a very large heat pipe has to be stacked with an even larger heat sink for a small heat generating element. As a result, a cooling device with a heat pipe and a heat sink takes up more space in both the planar and height directions than the heat generating element.

Also, when a heat sink is combined with a heat pipe, a number of separate components has to be assembled. This means performance varies between completed cooling devices.

In order to solve this problem, a technology has been proposed in which a recess is formed in the bottom surface of a heat sink and a heat pipe is laid inside the recess. An example of this is disclosed in Japanese Patent Application No. 2002-64170.

A configuration was disclosed in the '170 Application in which a recess is formed in the bottom surface of a heat sink and a heat pipe is laid inside the recess. The purpose of this configuration is to reduce the mounting area heightwise. As a result, a comprehensive heat exhaust design for the heat generating element cannot be undertaken.

SUMMARY OF THE PRESENT APPLICATION

While the disclosure in the '170 Application can reduce the mounting area heightwise, (1) the diffusion of heat conducted in sequential order from the heat generating element, the heat pipe and the heat sink is insufficient, (2) thermal diffusion is inadequate because the role sharing between the heat pipe and the heat sink is unclear, (3) the mounting area cannot be reduced in the planar direction because of insufficient thermal diffusion, and (4) the mounting area reduction heightwise is less than adequate in actuality because of an inadequate heat exhaust design.

Because the mounting area reduction is inadequate in the planar direction, there is a significant size discrepancy with respect to the heat generating element and this has an adverse effect on the overall mounting design for the electronic device.

Because the heat pipe characteristics and the heat sink characteristics cannot be optimized, the overall heat exhaust performance is deficient.

In light of this situation, the purpose of the Present Application is to provide a very small cooling device able to efficiently cool a heat generating element that generates a large amount of heat while also reducing the mounting area.

In order to solve this problem, the Present Application is a cooling device, wherein the cooling device comprises a base having a recessed part in a first surface, a plurality of heat radiating fins standing erect on a second surface being the reverse side of the first surface, and a flat, plate-like thermal diffusion part housed in the recessed part, wherein the upper surface of the thermal diffusion part makes thermal contact with the upper surface of the recessed part, the side surface of the thermal diffusion part makes thermal contact with the side surface of the recessed part, and wherein the thermal diffusion part diffuses in the planar and orthogonal directions heat from the heat generating element arranged on the bottom surface of the thermal diffusion part by vaporizing and condensing coolant sealed inside.

By embedding the heat pipe in the base of the heat sink, the cooling device of the Present Application is able to reduce the mounting area heightwise.

The heat device is also able to optimize the heat exhaust structure by incorporating a structure in which the heat pipe diffuses heat in the planar and orthogonal directions, and the diffused heat is radiated by a part of the heat sink. As a result, the cooling device can reduce the mounting area in the planar direction. This reduces the size discrepancy with respect to very small heat generating elements that generate a considerable amount of heat and is able to realize efficient cooling.

By minimizing the size of the heat pipe and the heat sink (that is, the base and the heat radiating fins) relative to the heat generating element, material and mounting costs can be reduced and electronic devices that are smaller and thinner can be realized.

The Present Application in the first claim is a cooling device, wherein the cooling device comprises a base having a recessed part in a first surface, a plurality of heat radiating fins standing erect on a second surface being the reverse side of the first surface, and a flat, plate-like thermal diffusion part housed in the recessed part, wherein the upper surface of the thermal diffusion part makes thermal contact with the upper surface of the recessed part, the side surface of the thermal diffusion part makes thermal contact with the side surface of the recessed part, and wherein the thermal diffusion part diffuses in the planar and orthogonal directions heat from the heat generating element arranged on the bottom surface of the thermal diffusion part by vaporizing and condensing coolant sealed inside. This configuration allows the heat radiating design of the cooling device to be optimized while reducing the mounting area heightwise. It also reduces the mounting area in the planar direction.

The Present Application in the second claim is the cooling device of the first claim, wherein the side surface with the recessed part makes thermal contact with the entire side surface of the thermal diffusion part. This configuration allows the thermal diffusion part to efficiently conduct the heat captured from the heat generating element to the base. Because the heat can be conducted to the entire base, the cooling device can be used as a whole to radiate heat from the heat generating element.

The Present Application in the third claim is the cooling device of the first or second claim, wherein the heat generating element is a small heat generating element, the cross-sectional area of the heat generating element being 10% to 30% of the cross-sectional area of the base in the planar direction. The configuration allows the cooling device to perform efficient cooling without a large size discrepancy between it and the small heat generating element.

The Present Application in the fourth claim is the cooling device in any one of the first through third claims, wherein the cross-sectional area of the thermal diffusion part is 50% to 80% of the cross-sectional area of the base in the planar direction. The configuration allows the cooling device to perform efficient cooling without a large size discrepancy between it and the small heat generating element.

The Present Application in the fifth claim is the cooling device in any one of first through fourth claims, wherein the thermal diffusion part diffuses in the planar and orthogonal directions heat from the heat generating element making thermal contact with a part of the lower surface of the thermal diffusion part, wherein heat is conducted from the upper surface of the thermal diffusion part to the upper surface of the recessed part, and wherein heat is conducted from the side surface of the thermal diffusion part to the side surface of the recessed part. This configuration allows the thermal diffusion part to conduct the heat captured from the heat generating element to the entire surface of the base. Because heat is not conducted only to certain spots in the center of the base or on the periphery of the base, the base and the heat radiating fins can be effectively utilized to dissipate heat efficiently.

The Present Application in the sixth claim is the cooling device in any one of first through fifth claims, wherein at least some of the heat conducted to the upper surface and side surface of the recessed part is radiated to the outside via the base and the heat radiating fins. This configuration allows the cooling device to radiate the heat conducted from the thermal diffusion part to the outside using the base and the heat radiating fins.

The Present Application in the seventh claim is the cooling device in any one of the first through sixth claims, wherein the thermal diffusion part comprises an upper plate, a lower plate opposing the upper plate, and one or more middle plates stacked between the upper plate and the lower plate, wherein coolant is sealed inside the interior spaces formed by the upper plate, the lower plate and the middle plate or plates, and wherein a vapor diffusing route and a capillary flow route are formed in at least a part of the middle plate or plates. This configuration allows the thermal diffusion part to diffuse the heat captured from the heat generating element in the planar and orthogonal directions. As a result, the thermal diffusion part can conduct heat to the entire base even when the heat generating element is very small.

The Present Application in the eighth claim is the cooling device of the seventh claim, wherein the middle plate has a notched part and an inner through-hole, wherein the notched part forms the vapor diffusing route and the inner through-hole forms the capillary flow route, wherein the vapor diffusing route diffuses the vaporized coolant in the planar and orthogonal directions, and wherein the capillary flow route returns the condensed coolant in the planar and orthogonal directions. This configuration allows the heat captured from the heat generating element to be diffused in the planar and orthogonal directions.

The Present Application in the ninth claim is the cooling device of the eighth claim, wherein there are a plurality of middle plates, wherein inner through-holes are formed in some of the stacked middle plates, and wherein a capillary flow route is formed with a cross-sectional area smaller than the cross-sectional area of the inner through-holes in the planar direction. This configuration increases the capillary action of the thermal diffusion part and returns the condensed coolant more quickly.

The Present Application in the tenth claim is the cooling device in any one of the seventh through ninth claims, wherein the upper plate and the lower plate are further equipped with a recessed part communicating at least with the capillary flow route and the vapor diffusing route. This configuration allows the thermal diffusion part to diffuse heat in both the planar and orthogonal directions.

The Present Application in the eleventh claim is the cooling device in any one of the seventh through tenth claims, wherein the thermal diffusion part is further equipped with an extension plate in which at least one of the upper plate, the lower plate or the middle plate is formed with an area greater than the others, wherein the extension plate protrudes from the side surface of the thermal diffusion part, and wherein the extension plate makes thermal contact with at least a part of the upper surface and the side surface of the recessed part. This configuration allows the thermal diffusion part to conduct heat transmitted to from the inside to the side surfaces to the side surface of the base. In other words, the thermal diffusion part can conduct heat from the heat generating element using the surface and interior of the entire base.

The Present Application in the twelfth claim is the cooling device of the eleventh claim, wherein the extension plate makes thermal contact with only the side surface of the recessed part. This configuration allows the thermal diffusion part to conduct heat diffused in the orthogonal direction from the upper surface of the thermal diffusion part to the base, and heat diffused in the planar direction from the extension plate to the base. As a result, the thermal diffusion part can conduct heat to the entire base.

The Present Application in the thirteenth claim is the cooling device in any one of the first through twelfth claims, wherein the upper surface and the side surface of the recessed part and the upper surface and the side surface of the thermal diffusion part make thermal contact via a thermal bonding material. This configuration allows the thermal diffusion part to more efficiently conduct heat to the base.

The Present Application in the fourteenth claim is the cooling device in any one of the first through thirteenth claims, wherein a heat generating element making thermal contact with the bottom surface of the thermal diffusion part is housed inside the recessed part, and wherein the opening in the recessed part is sealed while housing the thermal diffusion part and the heat generating element. This configuration allows for an even smaller cooling device.

The Present Application in the fifteenth claim is the cooling device in any one of the first through fourteenth claims, wherein the sum of the thickness of the base in the region including the recessed part and the height of the heat radiating fins is approximately the same as the sum of the thickness of the base in the region not including the recessed part and the height of the heat radiating fins. This configuration allows heat to be radiated evenly over the entire base and heat radiating fins constituting the heat sink.

The Present Application in the sixteenth claim is the cooling device in any one of the first through fifteenth claims, wherein the sum of the area of the heat radiating fins in the region opposite the recessed part is smaller than the sum of the area of the heat radiating fins in the region opposite the region without the recessed part. This configuration allows heat to be conducted from the center and periphery of the base opposite the thermal diffusion part to the heat generating fins.

BRIEF DESCRIPTION OF THE FIGURES

The organization and manner of the structure and operation of the Present Application, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Application may be susceptible to embodiment in different forms, there is shown in the Figures, and will be described herein in detail, specific embodiments, with the understanding that the disclosure is to be considered an exemplification of the principles of the Present Application, and is not intended to limit the Present Application to that as illustrated.

In the illustrated embodiments, directional representations—i.e., up, down, left, right, front, rear and the like, used for explaining the structure and movement of the various elements of the Present Application, are relative. These representations are appropriate when the elements are in the position shown in the Figures. If the description of the position of the elements changes, however, it is assumed that these representations are to be changed accordingly.

For purposes of the Present Application, a "heat pipe" can be any member, component, element or device able to cool a heat generating element by repeatedly vaporizing the coolant sealed inside with heat from the heat generating element and then cooling and condensing the vaporized coolant. Further, the word "pipe" is included in the term "heat pipe," but this can be any device that can cool a heat generating element by vaporizing and condensing the coolant in a member that meets the requirements of a pipe. Additionally, "heat sink" refers to a member able to make thermal contact with the heat generating element or the heat pipe in order to conduct and radiate heat to the outside.

Figures 1, 2, 3:
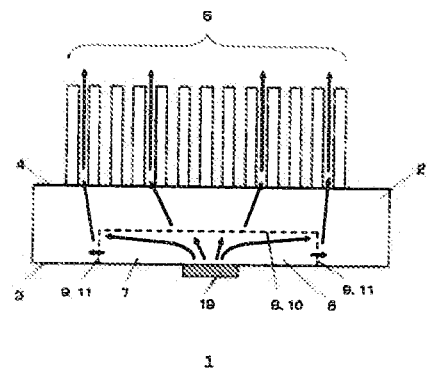
FIG. 1 illustrates a side view of a cooling device according to the Present Application.
FIG. 2 illustrates a perspective view of the cooling device of FIG. 1.
FIG. 3 illustrates a bottom view of the cooling device of FIG. 1.

Referring to FIGS. 1-2, the cooling device 1 comprises a base 2, a plurality of heat radiating fins 5 standing erect on the second surface 4 of the base 2, a recess 6 formed in the first surface 3 of the base 3, and a thermal diffusion part 7 housed in the recess 6. Here, the base 2 and the heat radiating fins 5 form a so-called heat sink.

The base 2 is a flat plate with a first surface 3 and a second surface 4. The first surface 3 and the second surface 4 are the surfaces of the base 2 that are broader in area than the other surfaces. In other words, among the surfaces of the base 2, the obverse surface is the second surface 4 and the reverse surface is the first surface 3.

The first surface 3 has a recessed part 6. This recessed part 6 is a recess carved into the base 2 from the first surface 3 and has a shape corresponding to the shape of the thermal diffusion part 7. A plurality of heat radiating fins 5 stand erect on the second surface 4, which is the surface on the other side of the first surface 3 in which the recessed part 6 is formed. The heat radiating fins 5 are rod shaped or plate shaped members. The heat is dissipated to the outside by the air currents formed in the spaces between the heat-radiating fins 5. The dissipated heat is conducted from the base 2.

A thermal diffusion part 7 with a flat plate shape in the interior is housed in the recessed part 6. The thermal diffusion part 7 is accommodated in the recessed part 6, the upper surface 8 of the thermal diffusion part 7 makes thermal contact with the upper surface 10 of the recessed part 6, and the side surface 9 of the thermal diffusion part 7 makes thermal contact with the side surface 11 of the recessed part 6. In other words, the thermal diffusion part 7 conducts heat to the base 2 via the recessed part 6. In FIG. 1 and FIG. 2, some or all of the thermal diffusion part 7 is indicated by the dotted lines.

The thermal diffusion part 7 makes thermal contact with the heat generating element 19 in order to capture heat from the heat generating element 19. The thermal diffusion part 7 has an interior space. By vaporizing and condensing the coolant sealed inside this interior space, the thermal diffusion part 7 can diffuse the heat captured from the heat generating element 19 in the planar and orthogonal directions. The arrows in FIG. 1 indicate the directions in which the heat is diffused by the thermal diffusion part 7. The thermal diffusion part 7 has a heat pipe structure in which coolant is sealed in the interior and heat is diffused by vaporizing and condensing the coolant. Because the thermal diffusion part 7 can make contact with the recessed part 6 over a broad surface, the heat captured from the heat generating element 19 can be conducted to the base 2 via the entire recessed part 6. Because the heat diffusing part 7 diffuses the heat in the planar and orthogonal direction by vaporizing and condensing the coolant sealed inside, the thermal diffusion part 7 can efficiently conduct the heat captured from the heat generating element 19 to the base 2.

The cooling device 1 has a plurality of heat radiating fins 5 standing erect on the second surface 4. In FIG. 2, the heat radiating fins 2 have a flat plate shape, and the fins are arranged in rows on top of the second surface 4 at a predetermined interval.

The names first surface 3 and second surface 4 are simply used to designate surfaces, and have no special significance. The surface in which the recessed part 6 is formed can be the first surface 3.

Because of this configuration (with the thermal diffusion part 7 housed in the recessed part 6 of the base 2 heightwise), the cooling device 1 requires a smaller mounting area heightwise.

The cooling device 1 has a configuration in which a thermal diffusion part 7 with a heat pipe structure is housed inside the base 2 forming the heat sink. The thermal diffusion part 7 diffuses the heat captured from the heat generating element 19 and conducts the heat to the base 2. The base 2 with a heat sink structure and the heat radiating fins 5 radiate the conducted heat to the outside. In other words, the cooling device 1 integrally realizes both the diffusion and radiation of heat from the heat generating element 19.

The thermal diffusion part 7 with a heat pipe captures heat from the heat generating element 19 with which it is in thermal contact. The heat generating element 10 can be an electronic component such as a semiconductor integrated circuit, a light emitting device or a power device. It can also be a mechanical component. The thermal diffusion part 7 has a coolant sealed in an interior space, and the heat captured from the heat generating element 10 vaporizes the coolant. The vaporized coolant is diffused inside the thermal diffusion part 7 in both the planar and orthogonal directions. The diffused vaporized coolant in the thermal diffusion part 7 can diffuse the heat captured from the heat generating element 19 in the planar and orthogonal directions. The thermal diffusion is indicated by the arrows inside the thermal diffusion part 7.

The diffusion of the vaporized coolant conducts the heat from the upper surface and the side surface of the thermal diffusion part 7 to the base 2. After the heat has been conducted to the base 2, the vaporized coolant is cooled, condensed and returned to liquid form. The condensed coolant returns from the upper surface and the side surface of the thermal diffusion part 7 to the bottom surface. On the bottom surface, it is again vaporized by the heat captured from the heat generating element 19.

The heat conducted to the base 2 moves inside the base 2 and reaches the heat radiating fins 5. The movement of the heat is indicated by the arrows inside the base 2 shown in FIG. 1. The heat moving through the inside of the base 2 reaches the heat radiating fins 5 and is radiated from the heat radiating fins 5 to the outside. Because the large surface area of the heat radiating fins 5 is in contact with the outside, heat is radiated and thermal convection occurs in the spaces formed between the heat radiating fins 5. This thermal convection radiates heat outward. The heat radiating outward from the heat radiating fins 5 is indicated by the arrows along the heat radiating fins 5 in FIG. 1.

Because the thermal diffusion part 7 can conduct heat from its upper surface and side surface to the base 2, heat can be conducted efficiently to the base 2. The thermal conduction from the thermal diffusion part 7 to the base 2 is more effective than the prior art in which the thermal diffusion part makes contact with the base only on the upper surface or side surface. In other words, the thermal diffusion part 7 can conduct heat along the entire upper surface and side surface of the recessed part 6. By conducting heat more efficiently along the entire surface of the recessed part 6 in the thermal diffusion part 7, the entire base 2 can be used to conduct heat to the heat radiating fins 5. As a result, the base 2 and the heat radiating fins 5 can radiate heat more effectively.

By efficiently conducting the heat from the heat generating element 19 from the thermal diffusion part 7 to the base 2, the entire cooling device 1 can efficiently cool the heat generating element 19. As a result, there is not much of a size discrepancy between the thermal diffusion part 7, base 2 and heat radiating fins 5 with respect to a small heat generating element 19 that generates a very large amount of heat. The diffusion and radiation of heat from a small heat generating element can thus be realized in a small area.

In this way, the area of the cooling device 1 can be minimized with respect to the heat generating element 19 in both the height and planar directions. As a result, the mounting area of the cooling device 1 can be minimized in both the height and planar directions, and heat from the heat generating element 19 can be efficiently cooled.

Referring to FIG. 3, the heat generating element 19 is small in size but generates a considerable amount of heat. In the prior art, the mounting area is reduced heightwise by simply housing the thermal diffusion part in the recessed part of the base. However, the thermal diffusion part cannot efficiently conduct the considerable amount of heat generated by the heat generating element. Thus, the size of the thermal diffusion part has to be increased (both heightwise and in the planar direction) in order to reliably conduct the heat to the base. If the thermal diffusion direction of the thermal diffusion part is not even, the thermal conduction of the thermal diffusion part is lopsided with heat conducted only from the upper surface of the recessed part or heat conducted from the side surface of the recessed part. This lopsided thermal conduction transfers a large amount of heat (heat flux) to one part of the base, and the thermal conduction from the base to the heat radiating fins is also lopsided.

The lopsided thermal conduction in the base and the heat radiating fins (forming the heat sink) leads to poor radiating efficiency relative to size. As a result, a cooling device of the prior art (a cooling device with a thermal diffusion member with a recessed part in the bottom surface of the base simply housing a heat pipe) is very large relative to the size of the heat generating element. This means the problem of a small heat generating element that generates a large amount of heat has still not been properly addressed.

It is clear from FIG. 3 that the thermal diffusion part 7 of the cooling device 1 is not disproportionately large with respect to the heat generating element 19. There is also no significant size disparity between the base 2 and the thermal diffusion part 7. In other words, the cooling device 1 has an optimum thermal design.

For example, the cross-sectional area of the heat generating element 19 in the planar direction (the area contacting the thermal diffusion part 7) is 10% to 30% of the cross-sectional area of the base 2 in the planar direction (the area of the first surface 3 of the base 2).

Also, the cross-sectional area of the thermal diffusion part 7 in the planar direction (the area of the thermal diffusion part 7 contacting the base 2) is 50% to 80% of the cross-sectional area of the base 2 in the planar direction (the area of the first surface of the base 2).

In other words, the mounting area of the cooling device 1 in the planar direction is not very large even when the heat generating element is a small electronic component that generates a very large amount of heat, such as a light emitting element or a light emitting diode (LED).

Therefore, the cooling device in this embodiment can effectively cool a heat generating element without being very large with respect to a small heat generating element that generates a large amount of heat.

The base 2 consists of heat radiating fins 5 and a heat sink. The base 2 consists of a heat sink for conducting heat from the thermal diffusion part 7 to the heat radiating fins 5. The base 2 is has a flat, plate-like shape. This flat, plate-like shape makes it easier to form a recessed part 6 and to erect the heat radiating fins 5. The base can be beveled or have a curved surface.

As long as the base 2 is a heat sink, it can have a three-dimensional shape other than a flat, plate-like shape such as a cylindrical shape. In this embodiment, the base 2 is rectangular, but it can also be polygonal, round or oval shaped.

The base is preferably made of a metal with high thermal conductivity such as copper, aluminum, tungsten or titanium, or a resin with superior heat resistance.

Because the base 2 is flat and plate-like, it has an obverse surface and a reverse surface. These are the first surface 3 and the second surface 4. The first surface 3 is the reverse surface of the base 2 in which the recessed part 6 is formed. The second surface 4 is the flip side of the first surface 3. The heat radiating fins 5 are formed in the second surface 4. The base 2 has a shape that allows a recessed part 6 for housing the thermal diffusion part 7 to be formed in one surface and the heat radiating fins 5 to be erected on the other surface. This allows a cooling device 1 with a reduced mounting area to be realized.

The recessed part 6 in the base 2 can be formed integrally when the base 2 is formed, or it can be carved out of the first surface 3 of a base 2 with a flat, plate-like shape. When formed integrally, a metal or resin is injected into a mold with a recessed part 6 and a base 2 with a recessed part 6 is molded.

A cooling device 1 with a thermal diffusion part 7 already housed in the recessed part 6 can be provided, or the thermal diffusion part 7 can be provided separately. Here, the user places the thermal diffusion part 7 in the recessed part 6 when used.

The recessed part 6 can extend as far as the end surfaces facing of a pair of bases 2 or it can stop before the end surface.

In the case of the former, the housed thermal diffusion part 7 can be seen from the side surface of the base 2, and the thermal diffusion part is easier to accommodate.

In the case of the latter, the housed thermal diffusion part 7 is housed completely inside the base 2. The entire side surface of the thermal diffusion part 7 can also make thermal contact with the side surface of the recessed part 6. As a result, the heat diffused by the thermal diffusion part 7 can be conducted to the base 2 from the upper surface and the side surface of the thermal diffusion part 7. In other words, the thermal diffusion part 7 can more readily conduct heat to the base 2.

FIG. 1 shows heat being conducted from the thermal diffusion part 7 to the base 2. In the cooling device 1 shown in FIG. 1, the recessed part 6 in the base 2 does not reach the end surfaces of the base 2, and the outer periphery of the recessed part 6 is completely surrounded by the base 2. Because the thermal diffusion part 7 is housed in the recessed part 6, the side surface of the recessed part 6 makes thermal contact with the entire side surface of the thermal diffusion part 7.

The thermal diffusion part 7 diffuses the heat captured from the heat generating element 19 in the planar and orthogonal directions. This is indicated by the arrows inside the thermal diffusion part 7 in FIG. 1. This thermal diffusion means the heat captured from the heat generating element 19 can be conducted to the entire upper surface 8 and side surface 9 of the thermal diffusion part 7. The upper part 8 of the thermal diffusion part 7 makes thermal contact with the upper surface 10 of the recessed part 6, and the heat is conducted from the upper surface 8 of the thermal diffusion part 7 to the upper surface 10 of the recessed part 6 as indicated by the arrow. Similarly, the entire side surface 9 of the thermal diffusion part 7 makes thermal contact with the entire side surface 11 of the recessed part 6. As a result, heat is conducted from the side surfaces 9 of the thermal diffusion part 7 to the side surface 11 of the recessed part 6.

Because the thermal diffusion part 7 can diffuse heat in both the planar and orthogonal directions, the entire side surface 9 of the thermal diffusion part 7 makes contact with the entire side surface 11 of the recessed part 6, and thermal conduction is conducted efficiently from the thermal diffusion part 7 to the base 2.

The base 2 receives heat from the upper surface 10 and the side surface 11 of the recessed part 6, and the heat passes through the entire base 2 and is conducted to the heat radiating fins 5. As a result, the size and thickness of the base 2 can be reduced in the planar direction and the mounting area of the cooling device 1 can be reduced. The mounting area of the cooling device 1 can be reduced because all of the heat is radiated from the heat radiating fins 5.

The heat radiating fins 5 are erected on the second surface 4 of the base 2. The heat radiating fins 5 radiates the heat conducted from the base 2 to the outside. The heat radiating fins 5 consist of a plurality of plate-like members or a plurality of rod-shaped members. A plurality of these members is erected on the second surface 4.

The plurality of heat radiating fins 5 can be soldered or bonded to the base 2 in an erect position. The heat radiating fins 5 can also be integrally molded to the base 2 using a mold. When integrally molded, the recessed part 6 is also integrally molded in the base. The plurality of heat radiating fins 5 can be arranged at a uniform interval or at irregular intervals. The heat radiating fins 5 can be configured in any way that allows the heat conducted from the base 2 to be radiated.

The heat radiating fins 5 are preferably made of a metal with high thermal conductivity such as copper, aluminum, tungsten or titanium, a resin with superior heat resistance or a composite of these. The fins 12 can be made from the same material as the base 11 or from a different material. However, the use of the same material can simplify the manufacturing process. If made from different materials, the materials should be selected to optimize the roles of these components, which is the radiation of heat in the case of the heat radiating fins 5 and thermal conduction in the case of the base 2.

The heat radiating fins 5 can be plate-like members as shown in FIG. 2. If the heat radiating fins 5 are plate-like members, the amount of heat conducted between the plate-like members by thermal convection can be increased, and the heat radiating fins 5 can radiate heat more efficiently. This also simplifies the manufacturing process.

Figure 4:
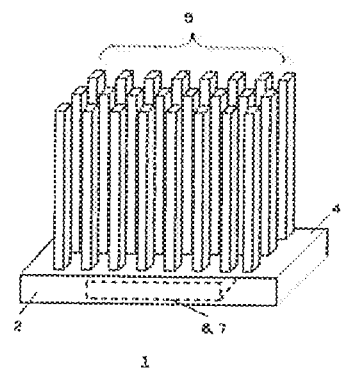
FIG. 4 illustrates a perspective view of another type of heat radiating fins for the cooling device of FIG. 1.

The heat radiating fins 5 can also have a rod shape as shown in FIG. 4.

FIG. 4 is a perspective view of another type of heat radiating fins for the cooling device in this embodiment of the Present Application. In FIG. 4, the rod-shaped heat radiating fins 5 are erected on the second surface 4 of the base 2. The rod-shaped heat generating fins 5 increase the overall surface area of the heat radiating fins 5 and increase the area of the heat generating fins 5 that is in contact with the outside. As a result, the heat generating fins 5 conduct heat to the outside more readily and radiate heat more efficiently.

FIG. 2 and FIG. 4 have heat radiating fins 5 with a prism shape. Here, the corners can be beveled or round columns can be used. The shape of the heat radiating fins 5 can be determined based on manufacturing conditions, the characteristics of the heat radiating element 19 to be cooled, and the characteristics of the electronic device in which they are mounted.

In addition to the heat radiating fins 5, heat can be radiated outward by the base 2.

The thermal diffusion part 7 makes thermal contact with the heat generating element 19, the heat from the heat generating element 19 is captured, and the heat is conducted to the base 2 via the recessed part 6. In the thermal diffusion part 7, thermal contact can be established between the heat generating element 19 and the recessed part 6 via a thermal interface material. This thermal interface material can be any heat radiating material in the form of a sheet, grease, elastomer or gel.

The thermal diffusion part 7 is housed in the recessed part 6. As a result, the thermal diffusion part 7 does not extend to the outside in the cooling device 1. As a result, a clean shape and reduced mounting area can be realized.

The heat captured from the heat generating element 19 can be diffused in both the planar and orthogonal directions by the thermal diffusion part 7. Therefore, it should have a plate-like shape and be made from a material with high thermal conductivity. It preferably has a heat pipe structure in which heat is diffused by vaporizing and condensing a coolant sealed inside.

A coolant is sealed inside the heat pipe, and the surface serving as the heat receiving surface makes contact with a heat generating element such as an electronic component. The heat from the heat generating element is received, the internal coolant is vaporized, and the heat from the heat generating element is captured during vaporization. The vaporized coolant moves inside the heat pipe. This movement carries away the heat from the heat generating element. The moving vaporized coolant is cooled and condensed at the heat radiating surface (or at a secondary cooling member such as a heat sink or cooling fan). The condensed liquid coolant is returned via the heat pipe to the heat receiving surface. The coolant moved to the heat receiving surface is then vaporized once again to capture heat from the heat generating element.

The repeated vaporization and condensation of the coolant allows the heat pipe to cool the heat generating element. In order to do so, the heat pipe needs a vapor diffusion route for diffusing the vaporized coolant inside and a capillary flow route for returning the condensed liquid coolant.

Figure 5:
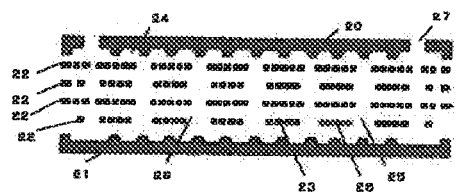
FIG. 5 illustrates an exploded cross-sectional side view of the thermal diffusion part of the cooling device of FIG. 1.
Figure 6:
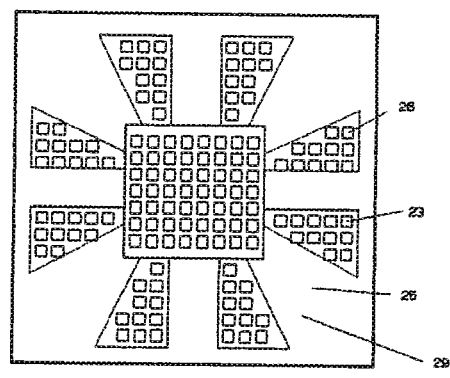
FIG. 6 illustrates an internal front view of the thermal diffusion part of FIG. 5.

Referring to FIGS. 5-6, the thermal diffusion part 7 is equipped with a flat, plate-like upper plate 20, a flat, plate-like lower plate 21 opposite the upper plate 20, and one or more middle plates 22 stacked between the upper plate 20 and the lower plate 21. Spaces are formed between the bonded upper plate 20, lower plate 21 and middle plate or plates 22. The coolant sealed inside these spaces is vaporized and condensed to diffuse the heat received from the heat generating element.

The middle plate 22 has a notched part 20 and an inner through-hole 23. The notched plate 29 forms the vapor diffusing route 25 for diffusing the vaporized coolant, and the inner through-hole 23 forms the capillary flow route 26 for returning the condensed coolant.

The upper plate 20 is a flat plate with a predetermined shape and area. The upper plate 20 is made from a metal or a resin. This is preferably a metal with high thermal conductivity and rust resistance such as copper, aluminum, silver, aluminum alloy, iron, iron alloy or stainless steel. The upper plate 20 can be rectangular, diamond-shaped, round, oval, polygonal or any other shape. However, a rectangular shape is preferred from the standpoint of easier manufacturing and mounting.

The surface of the upper plate 20 facing the middle plate 22 preferably has a recessed part 24 communicating at least with the vapor diffusing route 25 and the capillary flow route 26. By communicating with the vapor diffusing route 25 and the capillary flow route 26, the condensed coolant is readily transferred from the upper plate 20 to the capillary flow route 26. Because the recessed part 24 communicates with the vapor diffusing route 25, the vaporized coolant comes into ready contact with the heat radiating surface over a broad area, and the radiation of the heat in the vaporized coolant is accelerated. Because the recessed part 24 communicates with the vapor diffusing route 25, the vaporized coolant diffused in the vapor diffusing route 25 is transferred to the recessed part 24, which diffuses the vaporized coolant in the thickness direction as well. As a result, the thermal diffusion part 7 diffuses the received heat in both the planar and orthogonal directions.

When the thermal diffusion part 7 is arranged horizontally with respect to the ground level, the planar direction is the direction parallel to the ground level and the orthogonal direction is the direction perpendicular to the ground level. When the thermal diffusion part 7 is arranged obliquely or perpendicularly with respect to the ground level, the planar direction is the direction parallel to the flat, plate-like thermal diffusion part 7, and the orthogonal direction is the thickness direction of the flat, plate-like thermal diffusion part 7.

The upper plate 20 preferably has a protruding part or contact part connected to the middle plate 22. Here, the upper plate 20 is referred to as the "upper" plate as a matter of convenience. This does not mean that it is located physically in the upper position. The term is merely used to differentiate it from the lower plate 21. The upper plate 20 can be on the heat radiating side or the heat receiving side.

A coolant injection port 27 is formed in the upper plate 20. The upper plate 20, middle plate 22 and lower plate 21 are stacked and bonded to form an internal space. Because the coolant has to be sealed in the internal space, the coolant is sealed at the injection port 27 after the upper plate 20 and the other plates have been bonded together. When the coolant is to be sealed, the injection port 27 is sealed to seal the interior space.

The coolant can be sealed at the injection port 27 after the plates have been stacked, or the coolant can be sealed while the upper plate 20, the lower plate 21 and the middle plate 22 are being stacked.

One or more middle plates 22 are interposed between the lower plate 21 and the upper plate 20. The lower plate 21 is made from a metal or a resin. This is preferably a metal with high thermal conductivity such as copper, aluminum, silver, aluminum alloy, iron, iron alloy or stainless steel. It can be rectangular, diamond-shaped, round, oval, polygonal or any other shape. Because it is used to form a thermal diffusion part 7 opposite the upper plate 20, it should have the same shape and area as the upper plate 20. A rectangular shape is preferred from the standpoint of easier manufacturing and mounting.

Preferably, a recessed part 24 communicating with the vapor diffusing route 25 and the capillary flow route 26 is formed in the surface of the lower plate 21 facing the middle plate 22. The reasons for installing a recessed part 24 in the lower plate 21 are the same as those for installing a recessed part 24 in the upper plate 20.

Here, the lower plate 21 is referred to as the "lower" plate as a matter of convenience. This does not mean that it is located physically in the lower position. The term is merely used to differentiate it from the lower plate 20.

The lower plate 21 preferably has a protruding part or contact part connected to the middle plate 22.

The lower plate 21 can be on the heat radiating side or the heat receiving side.

One or more middle plates 22 is stacked between the upper plate 20 and the lower plate 21. The lower plate 22 is made from a metal or a resin. This is preferably a metal with high thermal conductivity such as copper, aluminum, silver, aluminum alloy, iron, iron alloy or stainless steel. It can be rectangular, diamond-shaped, round, oval, polygonal or any other shape. Because it is interposed between the upper plate 20 and the lower plate 21 to form a thermal diffusion part 7, it should have the same shape as the upper plate 20 and the lower plate 21. A rectangular shape is preferred from the standpoint of easier manufacturing and mounting. Because it is interposed between the upper plate 20 and the lower plate 21, the area of the middle plate 22 should be the same or somewhat smaller than the upper plate 20 and the lower plate 21.

The middle plate 22 preferably has protruding parts or contact parts to connect the upper plate 20 and the lower plate 21. The middle plate 22 also has an inner through-hole 23 with a very small cross-sectional area. This inner through-hole 23 forms the capillary flow route 26.

When the middle plate 22 is stacked between the upper plate 20 and the lower plate 21 and bonded, a thermal diffusion part 7 with a heat sink structure is formed. One or more middle plates 22 can be used. As described below, a plurality of middle plates 22 is preferred in order to form a capillary flow route 26 with a finer cross-sectional area.

The middle plate 22 has a notched part 29 and an inner through-hole 23. The notched part 29 forms the vapor diffusing route 25 in the thermal diffusion part 7. When a middle plate 22 is stacked between the upper plate 20 and the lower plate 21, the notched part 29 forms a gap. This gap forms the vapor diffusing route 25.

Here, the notched part 29 is formed facing the planar direction of the thermal diffusion part 7, and the vapor diffusing route 25 is formed facing the planar direction of the thermal diffusion part 7. The vaporized coolant is diffused in the planar direction. Also, because the notched part 29 is linked to the upper plate 20 and the lower plate 21, the vapor diffusing route 25 is connected from the upper plate 20 to the lower plate 21. In addition, the recessed part 24 and the vapor diffusing route 25 in the upper plate 20 and the lower plate 21 communicate. As a result, the vapor diffusing route 25 diffuses the vaporized coolant in the planar and orthogonal directions.

If the notched part 29 radiates outward from the center of the middle plate 22 as shown in FIG. 6, the vapor diffusing route 25 also radiates outward from the center of the thermal diffusion part 7. Because heat generating elements 19 are often arranged near the center of the thermal diffusion part 7, the coolant receives the heat near the center of the thermal diffusion part 7. As a result, the coolant is initially vaporized near the middle of the thermal diffusion part 7. When the vapor diffusing route 25 radiates from the center of the thermal diffusion part 7, the vaporized coolant near the center is diffused radially.

When the middle plate 22 has a notched part 29 and the vapor diffusing route 25 is formed in both the planar and orthogonal directions, the vaporized coolant inside the thermal diffusion part 7 radiates in both the planar and orthogonal directions. As a result, the heat from the heat generating element 19 is diffused inside the thermal diffusion part 7 in both the planar and orthogonal directions.

Note that the vapor diffusing route 25 does not have to have the radial shape shown in FIG. 6.

The middle plate 22 has an inner through-hole 23. This inner through-hole 23 is a very small through-hole, which forms the capillary flow route 26 for returning the condensed coolant. If the middle plate 22 has a notched part 29 as shown in FIG. 6, the inner through-hole 23 is formed in a part other than the notched part 29.

If a single middle plate 22 is used, the inner through-hole 23 formed in the middle plate 22 itself serves as the capillary flow route.

When a plurality of middle plates 22 is used, the inner through-holes 23 formed in the middle plates 22 are aligned partially to form a capillary flow route 26 with a cross-sectional area smaller than the cross-sectional area of the inner through-holes 23 in the planar direction. Because the inner through-holes 23 formed in a plurality of middle plates 22 are aligned to form a capillary flow route 26 with a cross-sectional area smaller than the cross-sectional area of the inner through-holes 23 themselves, the return of the condensed coolant in the capillary flow route 26 is more effective. Because the condensed coolant is returned by the capillary action in the capillary flow route 26, a capillary flow route 26 with a small cross-sectional area accelerates the return of the coolant.

A plurality of inner through-holes 23 can be formed in the middle plate 22. A plurality of inner through-holes 23 is preferred in order to function as a capillary flow route 26.

The inner through-hole 23 is formed from the obverse surface to the reverse surface of the middle plate 22. The shape can be round or oval. Because a part of various inner through-holes 23 can be overlapped to form the capillary flow route 26, inner through-holes 23 with a square shape is preferred. This is also preferred from the standpoint of ease of manufacturing.

The inner through-hole 23 can be formed by carving, pressing, wet etching or dry etching. However, wet etching or dry etching is preferred from the standpoint of small through-hole formation and precision machining.

If a plurality of middle plates 22 is used, inner through-holes 23 are formed in all of the middle plates 22. Because the inner through-holes 23 are to overlap only partially when the middle plates are stacked, the positions of the inner through-holes 23 should be staggered somewhat in the adjacent middle plates 22. The position of the inner through-hole 23 in a given middle plate 22 and the position of the inner through-hole 23 in an adjacent middle plate 22 overlap only partially in terms of the area of the inner through-holes 23. Because the positions of the inner through-holes 23 are staggered between adjacent middle plates 22, a capillary flow route 26 is formed when the middle plates 22 are stacked in which the cross-sectional area is smaller than the cross-sectional area of the inner through-holes 23 in the planar direction.

Holes with a cross-sectional area smaller than the cross-sectional area of the inner through-hole 23 form a route in the orthogonal direction when the heat pipe 18 is arranged in the orthogonal direction and the holes are connected to each other in the orthogonal direction. Because the holes are tiered in the orthogonal direction, a route is formed in which fluid can travel in both the orthogonal and planar directions. The passage formed in the orthogonal and planar directions has a very small cross-sectional area, and the condensed coolant returns in the orthogonal direction or in both the orthogonal and planar directions.

If only a part of the inner through-holes 23 overlaps to form a capillary flow route 26 with a cross-sectional area smaller than the inner through-holes 23, the capillary flow route 26 can be machined directly. This is advantageous from the standpoint of easy manufacturing.

This capillary flow route 26 returns condensed coolant, but it can also be used to transfer vaporized coolant.

The corners of the capillary flow route 26, the recessed part 26 and the notched part 29 should be chamfered. The cross-section of the capillary flow route 26 can be hexagonal, round, oval, square or polygonal. The cross-sectional shape of the capillary flow route 26 is determined by the shape of the inner through-holes 23 and how the inner through-holes 23 overlap. The cross-sectional area is determined in the same way.

The thermal diffusion part 7 is manufactured by stacking and bonding the upper plate 20, the lower plate 21 and the middle plate 22.

The upper plate 20, the lower plate 21 and the plurality of middle plates 22 (four middle plates 22 in FIG. 5) are aligned in a positional relationship in which they overlap in the same positions. The positional relationship of the middle plates 22 is also such that only a part of the inner through-holes 23 in the middle plates overlap.

The upper plate 20, the lower plate 21 and at least one of the middle plates 22 have bonding protrusions.

The upper plates 20, the lower plates 21 and the middle plates 22 are stacked together in this alignment, and directly bonded to each other and integrated using a heat press. At this time, the various members are directly bonded using the bonding protrusions.

Here, direct bonding means applying pressure and heat to the joined surfaces of at least two of the members and using the atomic forces acting between the surfaces to bond the atoms together securely. The joined surfaces of the two members are integrated and not bonded using an adhesive. The bonding protrusions are used to implement this secure bonding.

As for the direct bonding conditions for the heat press, the pressure is preferably between 40 kg/cm$^2$ and 150 kg/cm$^2$, and the temperature is preferably between 250 and 400° C.

Next, the coolant is injected via the injection ports 27 in a part of the upper plate 20 and the lower plate 21. Afterwards, the injection ports 27 are sealed to complete the thermal diffusion part 7. The sealing of the coolant is performed in a vacuum or under reduced pressed. The vacuum or reduced pressure is used to seal the coolant in the interior space of the thermal diffusion part 7 in a vacuum or under reduced pressure. When the pressure is reduced, the vaporization and condensation temperature of the coolant are lower, and this makes the repeated vaporization and condensation of the coolant more efficient.

These steps are used to manufacture a thermal diffusion part 7 with a flat, plate-like heat pipe structure, which is one example of a thermal diffusion part 2.

Figure 7:
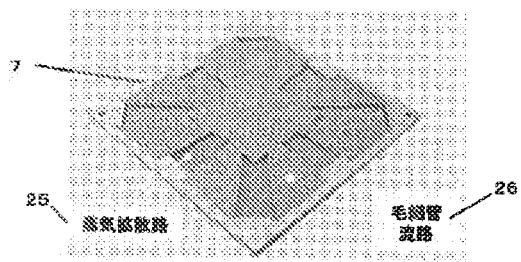
FIG. 7 illustrates an internal photograph of the thermal diffusion part of FIG. 5.

FIG. 7 is an internal photograph of the thermal diffusion part of this embodiment of the Present Application. FIG. 7 shows the inside of the thermal diffusion part 7. It is clear from FIG. 7 that the thermal diffusion part 7 is equipped with a vapor diffusing route 25 and a capillary flow route 26.

By giving the thermal diffusion part 7 the structure described above, the thermal diffusion part 7 is able to diffuse heat captured from the heat generating element 19 in both the planar and orthogonal directions. The diffused heat can also be conducted to the base 2 via the recessed part 6. Because heat can be conducted to the base 2 from the entire recessed part 6, the entire base 2 can be used to conduct heat to the heat radiating fins 5.

The base 2 and the heat radiating fins 5 diffuse the conducted heat to the outside. At this time, heat is radiated by the base 2 and the heat radiating fins 4 in their entirety. In other words, heat can be efficiently radiated by the entire base 2 and the entire heat radiating fins 5 (constituting the heat sink). As a result, the mounting area of the cooling device 1 can be reduced.

As mentioned above, the thermal diffusion part 7 is housed in the recessed part 2 of the base 2 in the cooling device 1 of this embodiment in order to reduce the mounting area height-wise. Also, the thermal diffusion of the thermal diffusion part 7 and the thermal conductivity of the thermal diffusion part 7 and the recessed part 6 are optimized in order to reduce the mounting area in the planar direction.

In the cooling device of another embodiment, the thermal diffusion part 7 and the recessed part 6 make thermal contact in a different way. As explained in a previous embodiment, the recessed part 6 has a first surface 3 shaped so as to be accommodated completely inside the base 2 without reaching the end surface of the base 2, or the first surface 3 is mated with the base 2 and shaped so as to reach at least one end surface facing another base 2.

Figure 8:
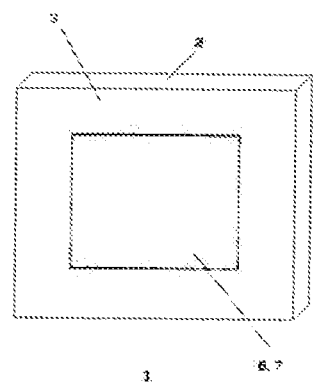
FIG. 8 illustrates a bottom view of another cooling device according to the Present Application.

In FIG. 8, the recessed part 6 has a shape that is complete accommodated inside the base 2. In other words, the recessed part 6 does not reach either end surface of the base 2. By forming the recessed part 6 so that neither end surface is reached, the thermal diffusion part 7 housed in the recessed part 6 can make thermal contact with all of the side surfaces of the recessed part 6. As a result, the thermal diffusion part 7 can efficiently conduct heat to the recessed part 6 (that is, to the base 2).

Figure 9:
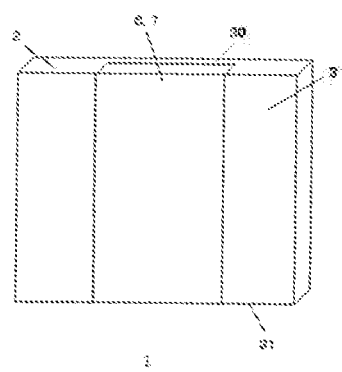
FIG. 9 illustrates a bottom view of the cooling device of FIG. 8.

As shown in FIG. 9, the recessed part 6 can be formed so as to reach the end surfaces of the base 2. FIG. 9 is a bottom view of the cooling device in one embodiment of the Present Application. FIG. 9 shows the cooling device 1 from the bottom surface.

In FIG. 9, the recessed part 6 is shaped to reach the end surfaces 30, 31 of the base 2. This shape allows the recessed part 6 in the base 2 to be formed easily. The thermal diffusion part 7 can also be easily installed in the recessed part 6. As a result, the cost of the cooling device 1 can be reduced.

The thermal diffusion part 7 makes thermal contact with the recessed part 6 via the extension plate installed on the thermal diffusion part 7.

The thermal diffusion part 3 is formed by stacking the upper plate 20, the lower plate 21 and the middle plate 22. Here, at least the upper plate 20, the lower plate 21 or the middle plate 22 is equipped with an extension plate 40 with an area larger than the others. This extension plate 40 protrudes from the side surface 9 of the thermal diffusion part 7, and the extension plate 40 makes thermal contact with at least a part of the upper surface 10 and side surface 11 of the recessed part 6. Using an extension plate 40 to make thermal contact with the recessed part 6 allows for more efficient conduction of heat from the heat diffusion part 7 to the recessed part 6 (that is, the base 2).

Figure 10:
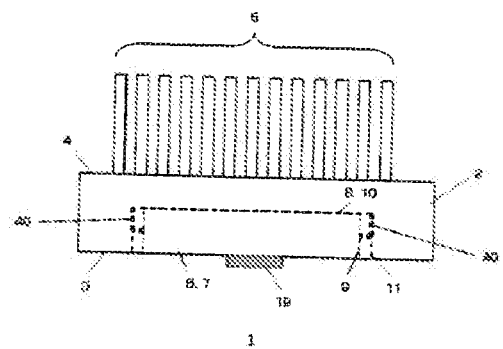
FIG. 10 illustrates a side view of the cooling device of FIG. 8.

Referring to FIG. 10, the cooling device 1 is equipped with a base 2 and heat radiating fins 5, and the thermal diffusion part 7 is accommodated inside the recessed part 6 in the first surface 3 of the base 2. This is the same configuration explained in a previous embodiment.

The thermal diffusion part 7 diffuses the heat captured from the heat generating element 19 in both the planar and orthogonal directions. This allows the thermal diffusion part 7 to conduct the heat to the base 2. Here, the thermal diffusion part 7 has a heat pipe structure, and the heat is diffused by vaporizing and condensing a coolant sealed inside. Because the heat diffusion part 7 is formed by stacking the upper plate 20, the lower plate 22 and the middle plate 22, the upper plate 20, the lower plate 22 and the middle plate 22 make contact with the vaporized coolant.

As a result, the heat is transferred to the upper plate 20, the lower plate 22 and the middle plate 22 via contact with the vaporized coolant inside the thermal diffusion part 7. Because the extension plate 40 formed on at least the upper plate 20, the lower plate 22 or the middle plate 22 has an area larger than the others, the heat inside the thermal diffusion part 7 is transferred to the extension plate 40.

The heat conducted by contact between the extension plate 40 and the vaporized coolant in the thermal diffusion part 7 can be conducted out of the thermal diffusion part 7.

In the cooling device 1 shown in FIG. 10, the extension plate 40 makes thermal contact with the side surface 11 of the recessed part 6. At this time, the extension plate 40 can make thermal contact with the side surface 11 of the recessed part 6 via a thermal interface material. The extension plate 40 transfers the heat conducted from the vaporized coolant inside the thermal diffusion part 7 to the outside of the thermal diffusion part 7 and into the side surface 11 of the recessed part 6 making thermal contact.

Because the extension plate 40 is integrated with one of the plate members constituting the thermal diffusion part 7, the thermal resistance from the inside of the thermal diffusion part 7 to the extension plate 40 is reduced. Because the thermal resistance is low, the thermal conduction is efficient. In other words, the heat inside the thermal diffusion part 7 is conducted efficiently to the extension plate 40. Because the extension plate 40 extends from the side surface of the thermal diffusion part 7, the heat inside the thermal diffusion part 7 can be conducted to the recessed part 6 along with the heat from the main body (upper surface 8 and side surface 9) of the thermal diffusion part 7.

By extending the extension plate 40 from the thermal diffusion part 7 and making thermal contact with the recessed part 6, the thermal diffusion part 7 can more efficiently conduct heat to the recessed part 6.

The side surface 11 of the recessed part 6 is subjected to this thermal conduction and conducts heat from the heat generating element 19 diffused by the thermal diffusion part 7 to the base 2. The conduction of heat from the side surface 11 of the recessed part 6 to the base 2 at this time allows the heat to be conducted to the outer edge of the base 2. Heat is also conducted from the upper surface 8 of the thermal diffusion part 7 to the upper surface 10 of the recessed part 6. In this way, the thermal diffusion part 7 can conduct heat from the upper surface 8 and the extension plate 40 to the entire upper surface 10 and side surface 11 of the recessed part 6. As a result, heat is conducted to the entire base 2.

Because heat is conducted to the entire base 2 via the recessed part 6, the entire base 2 can be used to conduct heat to the heat radiating fins 5. As a result, the heat radiating efficiency of the heat radiating fins 5 is increased, and the cooling efficiency of the entire cooling device 1 is increased relative to the mounting area.

Because the extension plate 40 formed with a plate member constituting the thermal diffusion part 7 conducts heat from the thermal diffusion part 7 to the recessed part 6, the thermal diffusion part 7 can more efficiently conduct the heat captured from the heat generating element 19 to the recessed part 6. Also, the entire base 2 can conduct heat to the heat radiating fins 5.

Figure 11:
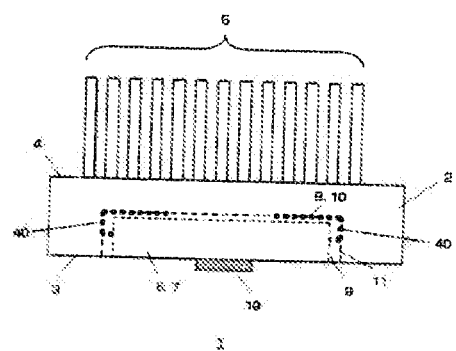
FIG. 11 illustrates a side view of the cooling device of FIG. 8.

As shown in FIG. 11, the extension plate 40 can be bent in the curved part to make thermal contact with the side surface 11 and the upper surface 10 of the recessed part 6. Unlike the cooling device 1 shown in FIG. 10, the extension plate 40 extends to the upper surface of the recessed part 6 and makes thermal contact with the upper surface 10 of the recessed part 6.

Because the extension plate 40 makes thermal contact with the upper surface 10 of the recessed part 6, the heat conducted from the interior of the thermal diffusion part 7 is conducted to the upper surface 10 of the recessed part 6 in addition to the side surface 11 of the recessed part 11. When the thermal diffusion part 7 diffuses heat in the planar direction with superior efficiency, heat is conducted more efficiently to the upper surface 10 of the recessed part 6 via the extension plate 40 than to the recessed part 10 from the upper surface 8 of the thermal diffusion part 7. Here, as shown in FIG. 11, the extension plate 40 should make thermal contact with the upper surface 10 of the recessed part 6 as well.

When the extension plate 40 has a configuration in which it only makes thermal contact with the side surface 11 of the recessed part 6 and the upper surface 8 of the thermal diffusion part 7 makes thermal contact with the upper surface of the recessed part 10 (that is, the configuration in FIG. 10), the thermal conduction part 7 is able to realize optimum thermal conduction to the recessed part 6 based on the characteristics of the heat diffusion direction. In other words, in a thermal diffusion part 7 with a heat pipe structure, in which an upper plate 20, a lower plate 21 and a middle 22 are stacked, the vaporized coolant dispersed in the interior space is dispersed in both the planar and orthogonal directions. This heat can be readily dispersed to the upper surface 8 of the thermal diffusion part 7 via coolant dispersed in the orthogonal direction. When the upper surface 8 of the thermal diffusion part 7 makes thermal contact with the upper surface of the recessed part 10, this is the preferred surface for thermal conduction from the thermal diffusion part 7 to the base 2. The coolant dispersed in the planar direction is dispersed to the side surface 9 of the thermal diffusion part 7. However, because the area of the side surface 9 of the thermal diffusion part 7 is narrow, thermal contact is preferably made with the side surface 11 of the recessed part 6. This increases the thermal conduction efficiency to the side surface of the recessed part 6 and increases the thermal conduction efficiency from the thermal diffusion part 7 to the base 2.

In this way, the extension plate 40 conducts heat from the interior of the thermal diffusion part 7 to the recessed part 6. As a result, the extension plate 40 should be a middle plate 22 with a larger area than the rest of the members as shown in FIG. 12.

Figure 12:
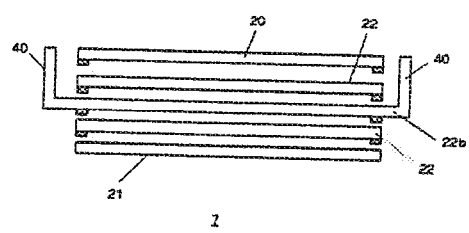
FIG. 12 illustrates an exploded side view of the thermal diffusion part of the cooling device of FIG. 8.

FIG. 12 shows three middle plates 22 stacked between the upper plate 20 and the lower plate 21. One of the middle plates 22b among the three middle plates 22 has a larger area than the other middle plates 22 and extends beyond the side surface of the thermal diffusion part 7. The protruding part is bent to form an extension plate 40 able to make contact with the side surface 11 of the recessed part 6.

By making middle plate 22b the extension plate 40, the vaporized coolant diffused inside the thermal diffusion part 7 can make ready contact with the middle plate 22b, and this contact conducts the heat inside the thermal diffusion part 7 to the extension plate 40 via the middle plate 22b. The extension plate 40 conducts heat from the interior to the side surface 11 and the upper surface 10 of the recessed part 6. As a result, the thermal diffusion part 7 can efficiently conduct heat to the entire base 2.

The extension plate 40 can be bent in a variety of ways as long as it makes thermal contact with a surface of the recessed part 6.

Of course, the extension plate 40 can be formed by making the area of the upper plate 20 or the lower plate 21 larger than the other members. When a pair of middle plates 22 are made into extension plates 40, the middle plate 22 nearer the upper plate 20 should be used as actual extension plate 40 here. However, this increases the amount of contact with the vaporized coolant.

If the extension plate 40 extending from the side surface of the thermal diffusion part 7 is used to make thermal contact with at least the upper surface 10 and the side surface 11 of the recessed surface 6, the cooling device 1 in one embodiment can conduct heat from the heat generating element 19 to the entire base 2. As a result, the cooling efficiency of the cooling device 1 can be increased even with the thermal diffusion part 7 housed inside the base 2 to reduce the mounting area of the cooling device 1.

The extension plate 40 extending from the side surface of the thermal diffusion part 7 not only extends from the side surface but the extension plate 40 extends beyond the side surface.

Figure 13:
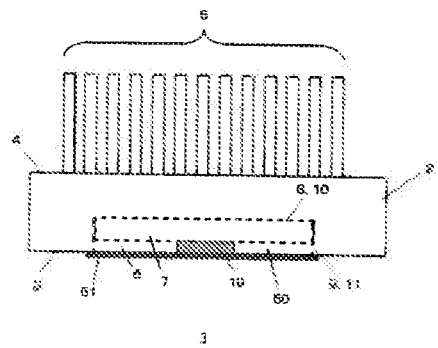
FIG. 13 illustrates a side view of another cooling device according to the Present Application.

In another embodiment, a cooling device housing both the thermal diffusion part 7 and the heat generating element 19 in the recessed part 6 is explained. Referring to FIG. 13, the interior of the cooling device 1 is visible. In the cooling device 1 of one embodiment, both the thermal diffusion part 7 and the heat generating element 19 are housed in the recessed part 6. The recessed part 6 is formed in the first surface 3 of the base 2. The area of the recessed part 6 is determined freely based on the size of the base 2 and the performance of the cooling device 1. If the recessed part 6 is deep, the thermal diffusion part 7 and the heat generating element 19 can both be accommodated.

By housing the heat generating element 19 in the recessed part 6 along with the thermal diffusion part 7, the mounting area of the cooling device 1 can be further reduced.

A recessed part 6 deep enough to house both the thermal diffusion part 7 and the heat generating element 19 is formed in the first surface 3 of the base 2. The recessed part 6 can be deep enough to completely house the heat generating element 19, but it can also be deep enough to allow the heat generating element 19 to protrude somewhat from the recessed part 6.

Thermal contact can be made between the thermal diffusion part 7 and the heat generating element 19 via a thermal interface material. For example, the extra space 50 in the recessed part 6 not occupied by the thermal diffusion part 7 and the heat generating element 19 can be filled with a thermal interface material. Filling the extra space with a thermal interface material allows the heat from the heat generating element 19 to be conducted to the base 2 using the entire space.

With the exception of combining the thermal diffusion part 7 with the heat generating element 19 in the recessed part 6, the cooling device 1 can have the same structure explained in a previous embodiment.

In other words, the thermal diffusion part 7 can be equipped with an extension plate 40, and the extension plate 40 can make thermal contact with the side surface and upper surface of the recessed part 6. By making thermal contact between the extension plate 40 and the side surface and upper surface of the recessed part 6, the thermal diffusion part 7 can efficiently conduct heat to the base 2. The extension plate 40 is the same as those explained in one embodiment.

By housing both the thermal diffusion part 7 and the heat generating element 19 inside the recessed part 6, the mounting area of the cooling device 1 can be reduced and the appearance of the cooling device can be made sleeker.

The recessed part 6 has an opening in the first surface 3. As in a previous embodiment, when only the thermal diffusion part 7 was housed in the recessed part 6, the opening is closed by the thermal diffusion part 7. Most heat generating elements 19 are smaller than the thermal diffusion part 7 so they are usually smaller than the opening in the recessed part 6. As a result, in one embodiment, the opening in the recessed part 6 remains exposed when the heat generating element 7 is housed along with the thermal diffusion part 7 inside the recessed part 6.

Here, the opening in the recessed part 6 is sealed as shown in FIG. 13.

A sealing material 51 is used to seal the opening in the recessed part 6. When the opening is sealed with the sealing material 51, the heat from the heat generating element 19 cannot leak to the outside via the opening. As a result, nearly all of the heat from the heat generating element 19 is conducted to the thermal diffusion part 7, conducted from the thermal diffusion part 7 to the heat radiating fins 5, and radiated. Thus, the cooling device 1 makes efficient use of the thermal diffusion part 7, the base 2 and the heat radiating fins 5 to radiate the heat from the heat generating element 19. In other words, nearly all of the heat from the heat generating element 19 is radiated by the cooling device 1 with the thermal diffusion part 7 as the point of origin.

Also, by sealing the opening with a sealing material 51, the heat from the heat generating element 19 is much less likely to be transferred to the board making contact with the heat generating element 9. As a result, the heat generating element 19 is less likely to have an adverse effect on the board.

By housing both the thermal diffusion part 7 and the heat generating element 19 in the recessed part 6 and sealing the opening 6 with a sealing material 51, the mounting area can be reduced while also improving radiating efficiency.

Figure 14:
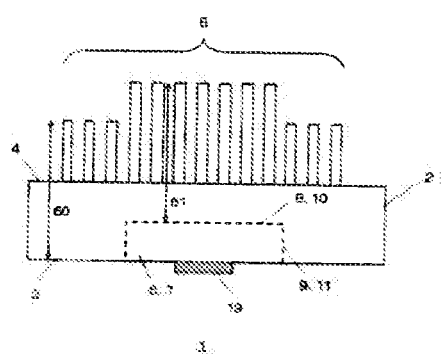
FIG. 14 illustrates a side view of the cooling device of FIG. 13.

In another embodiment, a cooling device is explained in which the sum of the heights of the base 2 and the radiating fins 5 is adjusted. Referring to FIG. 14, in this cooling device 1, the heat from the thermal diffusion protrusion 7 is radiated to the outside via the base 2 and the heat radiating fins 5. Here, the heat radiating fins 5 radiate the heat to the outside from the surface.

Because the recessed part 6 is in the first surface 3 of the base 2, the height varies by location on the cooling device 1 when the bottom surface of the base 2 is used as the point of reference. In other words, the height from the upper surface 10 of the recessed part 6 is the sum of the heights of the base 2 and the radiating fins 5 in the region with the recessed part 6, and the height from the bottom surface of the base 2 to the radiating fins 5 is the sum of the heights of the base 2 and the heat radiating fins 5 in the region without the recessed part 6.

In the cooling device 1 shown in FIG. 1, the sum of the heights of the base 2 and the heat radiating fins 5 in the region with the recessed part 6 differs from the sum of the heights of the base 2 and the heat radiating fins 5 in the region without the recessed part 6.

In the cooling device 1 of one embodiment, as shown in FIG. 14, the sum of the heights of the base 2 and the heat radiating fins 5 in the region with the recessed part 6 is nearly the same as the sum of the heights of the base 2 and the heat radiating fins 5 in the region without the recessed part 6. In FIG. 14, arrow 60 indicates the sum of the heights of the base 2 and the heat radiating fins 4 in the region without the recessed part 6. Similarly, arrow 61 indicates the sum of the heights of the base 2 and the heat radiating fins 4 in the region with the recessed part 6. It is clear from arrow 60 and arrow 61 that the sum of the heights of the base 2 and the heat radiating fins 5 in the region with the recessed part 6 is nearly the same as the sum of the heights of the base 2 and the heat radiating fins 5 in the region without the recessed part 6. The cooling device 1 radiates heat to the outside via the base 2 and the heat radiating fins 5.

In the cooling device 1 shown in FIG. 14, the sum of the heights of the base 2 and the heat radiation fins 5 is nearly the same whether or not the recessed part 6 is present. As a result, the heat radiating performance is uniform over the entire cooling device 1. In other words, the heat radiating efficiency of the cooling device 1 does not vary depending on component or region. As a result, the balance between the mounting area and the heat radiating performance is optimized in the cooling device 1, and the cooling device 1 has both high cooling performance and a reduced mounting area.

Figure 15:
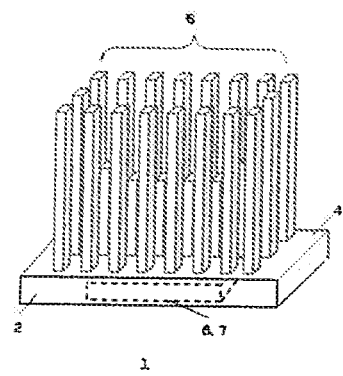
FIG. 15 illustrates a perspective view of the cooling device of FIG. 13.

Referring to FIG. 15, rod-shaped heat radiating fins 5 have been installed. The recessed part 6 is formed in the first surface 3 of the base 2, and the radiating fins 5 are installed on the second surface 4. In FIG. 15, the sum total of the volume of the heat radiating fins 5 erected in the region opposite the recessed part 6 is smaller than the sum total of the [volume of the] heat radiating fins 5 erected in the region opposite the region without the recessed part.

The volume of the heat radiating fins 5 can be used to control the thermal resistance of the base 2. More specifically, the thermal resistance of the base 2 in the region where the volume of the heat radiating fins 5 is small is greater than the thermal resistance of the base 2 in the region where the volume of the heat radiating fins 5 is great. Thus, in the cooling device 1 shown in FIG. 15, the thermal resistance of the base 2 in the region opposite the recessed part 6 is greater than the thermal resistance of the base 2 in the region opposite the region without the recessed part 6.

Because the thermal resistance of the base 2 in the region opposite the recessed part 6 is greater than the thermal resistance surrounding the base 2, the heat conducted by the thermal diffusion part 7 is readily conducted to the periphery of the base 2. Because the heat is readily conducted to the periphery of the base 2, the heat from the thermal diffusion part 7 is transferred by the entire base 2 to the heat radiating fins 5. As a result, the entire base 2 and all of the heat radiating fins 5 can be used by the cooling device 1 to radiate heat. In other words, the cooling performance of the cooling device 1 is improved.

Here, the imbalance in the volume sum totals should be aligned with the imbalance in height as shown in FIG. 14. For example, the width and number of rod-shaped heat radiating fins 5 are adjusted, the sum total for the volume of the heat radiating fins 5 in the region opposite the recessed part 6 is reduced, and the height of the heat radiating fins 5 in the region opposite the recessed part 6 is increased. While the sum of the heights of the base 2 and the heat radiating fins 5 in the region with the recessed part 6 is nearly the same as the sum of the heights of the base 2 and the heat radiating fins 5 in the region without the recessed part 6, the sum total of the volume of the heat radiating fins 5 in the region opposite the recessed part 6 is smaller than the sum total of the volume of the heat radiating fins 5 in the region opposite the region without the recessed part 6. The imbalance in the volume sum totals includes not installing heat radiating fins 5 in the region opposite the recessed part 6.

By controlling the height and volume of the heat radiating fins 5 in the cooling device 1 of one embodiment, the cooling performance of the cooling device 1 can be improved while reducing the mounting area.

Figure 16:
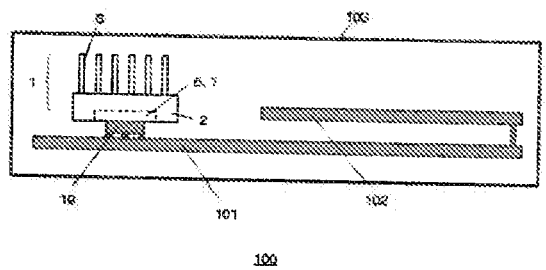
FIG. 16 illustrates an internal view of an electronic device according to the Present Application.

FIG. 16 is an internal view of an electronic device. This electronic device 100 comprises a case 103, electronic boards 101, 102 housed inside the case 103, a heat generating element 19 mounted on electronic board 101, and a cooling device 1 for cooling the heat generating element 19. The cooling device 1 can have the configuration of any one of the cooling devices explained in a previous embodiment.

The heat generating element 19 is an electronic component mounted on electronic substrate 101. It generates heat as it operates. The cooling device 1 is mounted on the heat generating element 19. The heat generating element 19 has to be cooled, but the space for mounting the cooling device is limited because the case 10 has to be small and thin.

As explained in a previous embodiment, the cooling device 1 has an optimized heat radiating design in which a thermal diffusion part 7 is housed in a recessed part 6 to reduce the mounting area. As a result, this cooling device 1 can efficiently cool the heat generating element 19 without compromising the design of the compact, thin electronic device 100.

The electronic device 100 in which the electronic board 101 containing the cooling device 1 has been mounted can prevent overheating and problems resulting from the overheating of the electronic components and electronic boards. This electric device 100 can be any type of electronic device. Examples of electronic devices 100 include notebook computers, desktop computers, server devices, portable terminals, cell phones, and onboard navigation devices.

Figure 17:
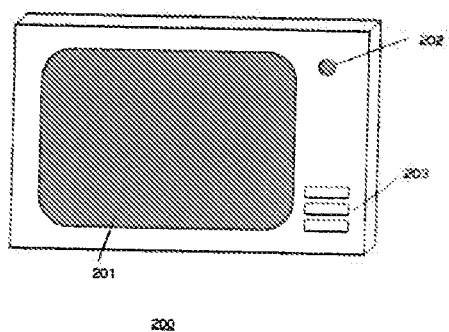
FIG. 17 illustrates a perspective view of the electronic device of FIG. 16.

Referring to FIG. 17, this electronic device 200 is an electronic device that has to be thin and compact, such as an automobile monitor or a personal monitor. The electronic device 200 comprises a display 201, a light-emitting device 202 and a speaker 203. An electronic board containing a cooling device 1 is housed inside this electronic device 200. A heat generating element is mounted on the electronic board, and the cooling device 1 is arranged so as to make thermal contact with the heat generating element.

This cooling device 1 can efficiently cool the heat generating element in a reduced mounting area so as not to compromise the thin, compact design of the electronic device 1. As a result, the electronic device 200 does not malfunction or experience poor performance.

This cooling device 1 can replace the large liquid-cooled devices as well as heat sinks and heat pipes currently mounted in notebook computers, portable terminals and computer terminals. It can also replace the heat radiating fins and cooling devices mounted in automobiles, industrial equipments, engines and control computers. As a result, the cooling device 1 and electronic boards containing the cooling device 1 can be applied to a wide variety of applications (electronic devices, industrial equipment, automobiles, aircraft, transportation equipment).

The cooling device 1 can also be arranged on slot-type electronic board that are housed inside server devices.

Figure 18:
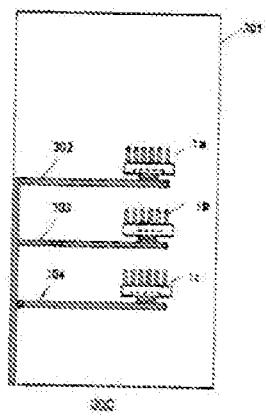
FIG. 18 illustrates an internal block diagram of the server device according to the Present Application.

FIG. 18 is an internal block diagram of the server device in one embodiment of the Present Application. One example of an electronic device is the server device 300 shown in FIG. 18. The server device 300 has slots for mounting electronic board inside the case 301, and a plurality of electronic boards 302, 303, 304 are mounted in these slots. Electronic components that are heat generating elements are mounted on electronic boards 302, 303 and 304. A cooling device 1a is arranged on the electronic component mounted on electronic board 302, cooling device 1b is arranged on the electronic component mounted on electronic board 303, and cooling device 1c is arranged on the electronic component mounted on electronic board 304. These cooling devices 1a-1c cool the various electronic boards 302-304.

Because the mounting area can be reduced, cooling devices 1a-1c can be adapted to narrow spaces with the electronic boards installed in the slot.

Because multiple electronic boards can be installed in narrow spaces as shown in FIG. 18, the server device 300 can have difficulty cooling the electronic boards. However, these cooling devices 1a-1c can effectively cool a plurality of electronic boards.

As explained above, the cooling device of the Present Application can be adapted to an electronic device with the high-density mounting of components such as a server device 300. An electronic device equipped with a cooling device of the Present Application can not only be made smaller and thinner, but performance deterioration due to the generation of heat can be prevented.

While a preferred embodiment of the Present Application is shown and described, it is envisioned that those skilled in the art may devise various modifications without departing from the spirit and scope of the foregoing Description and the appended Claims.

What is claimed is:

1. A cooling device, the cooling device comprising:
   a base, the base including a recessed part in a first surface;
   a plurality of heat radiating fins, the fins standing erect on a second surface, the second surface being the reverse side of the first surface; and
   a flat, plate-like thermal diffusion part housed in the recessed part, the upper surface of the thermal diffusion part making thermal contact with the upper surface of the recessed part, the side surface of the thermal diffusion part making thermal contact with the side surface of the recessed part;
   wherein the thermal diffusion part diffuses, in the planar and orthogonal directions, heat from a heat generating element, the heat generating element being arranged on the bottom surface of the thermal diffusion part by vaporizing and condensing coolant sealed inside and making thermal contact with a part of the lower surface of the thermal diffusion part.

2. The cooling device of claim 1, wherein the side surface of the recessed part makes thermal contact with the entire side surface of the thermal diffusion part.

3. The cooling device of claim 2, wherein the heat generating element is a small heat generating element, the cross-sectional area thereof being 10% to 30% of the cross-sectional area of the base in the planar direction.

4. The cooling device of claim 2, wherein the cross-sectional area of the thermal diffusion part is 50% to 80% of the cross-sectional area of the base in the planar direction.

5. The cooling device of claim 4, wherein heat is conducted from the upper surface of the thermal diffusion part to the upper surface of the recessed part.

6. The cooling device of claim 5, wherein heat is conducted from the side surface of the thermal diffusion part to the side surface of the recessed part.

7. The cooling device of claim 6, wherein at least some of the heat conducted to the upper surface and side surface of the recessed part is radiated to the outside via the base and the heat radiating fins.

8. The cooling device of claim 7, wherein the thermal diffusion part comprises an upper plate, a lower plate opposing the upper plate, and one or more middle plates stacked between the upper plate and the lower plate.

9. The cooling device of claim 8, wherein the middle plate has a notched part and an inner through-hole, the notched part forming the vapor diffusing route and the inner through-hole forming the capillary flow route, the vapor diffusing route diffusing the vaporized coolant in the planar and orthogonal directions, the capillary flow route returning the condensed coolant in the planar and orthogonal directions.

10. The cooling device of claim 9, wherein there are a plurality of middle plates, inner through-holes being formed in some of the stacked middle plates.

11. The cooling device of claim 10, wherein a capillary flow route is formed with a cross-sectional area smaller than the cross-sectional area of the inner through-holes in the planar direction.

12. The cooling device of claim 11, wherein the upper plate and the lower plate further include a recessed part, the recessed part communicating at least with the capillary flow route and the vapor diffusing route.

13. The cooling device of claim 12, wherein the thermal diffusion part further includes an extension plate in which at least one of the upper plate, the lower plate or the middle plate is formed with an area greater than the others, the extension plate protruding from the side surface of the thermal diffusion part, and making thermal contact with at least a part of the upper surface and the side surface of the recessed part.

14. The cooling device of claim 13, wherein the extension plate makes thermal contact with only the side surface of the recessed part.

15. The cooling device of claim 14, wherein the upper surface and the side surface of the recessed part and the upper surface and the side surface of the thermal diffusion part make thermal contact via a thermal bonding material.

16. The cooling device of claim 15, wherein the heat generating element making thermal contact with the bottom surface of the thermal diffusion part is housed inside the recessed part, the opening in the recessed part being sealed while housing the thermal diffusion part and the heat generating element.

17. The cooling device of claim 16, wherein the sum of the thickness of the base in the region including the recessed part and the height of the heat radiating fins are approximately the same as the sum of the thickness of the base in the region not including the recessed part and the height of the heat radiating fins.

18. The cooling device of claim 17, wherein the sum of the area of the heat radiating fins in the region opposite the recessed part is smaller than the sum of the area of the heat radiating fins in the region opposite the region without the recessed part.

19. An electronic device, the electronic device comprising:
   a cooling device, the cooling device comprising:
      a base, the base including a recessed part in a first surface;
      a plurality of heat radiating fins, the fins standing erect on a second surface, the second surface being the reverse side of the first surface; and
      a flat, plate-like thermal diffusion part housed in the recessed part, the upper surface of the thermal diffusion part making thermal contact with the upper surface of the recessed part, the side surface of the thermal diffusion part making thermal contact with the side surface of the recessed part;

wherein the thermal diffusion part diffuses, in the planar and orthogonal directions, heat from a heat generating element, the heat generating element being arranged on the bottom surface of the thermal diffusion part by vaporizing and condensing coolant sealed inside and making thermal contact with a part of the lower surface of the thermal diffusion part;

an electronic board on which a heat generating element is mounted; and a case, the case housing the electronic board.

20. The electronic device of claim 19, wherein the electronic device is selected from the group consisting of a notebook computer, a desktop computer, a server device, a portable terminal, a cell phone and an onboard electronic terminal.

\* \* \* \* \*